United States Patent [19]
Nishimura et al.

[11] Patent Number: 4,948,742
[45] Date of Patent: Aug. 14, 1990

[54] METHOD OF MANUFACTURING A SEMICONDUCTOR DEVICE

[75] Inventors: Tadashi Nishimura; Yoichi Akasaka, both of Itami, Japan

[73] Assignee: Mitsubishi Denki Kabushiki Kaisha, Tokyo, Japan

[21] Appl. No.: 437,778

[22] Filed: Nov. 20, 1989

Related U.S. Application Data

[63] Continuation of Ser. No. 238,251, Aug. 30, 1988, abandoned.

[30] Foreign Application Priority Data

Sep. 8, 1987 [JP] Japan .................. 62-225025
Sep. 8, 1987 [JP] Japan .................. 62-225027

[51] Int. Cl.$^5$ ............... H01L 21/265; H01L 21/20
[52] U.S. Cl. ............................. 437/24; 437/26; 437/62; 437/67; 437/68; 437/83
[58] Field of Search .............. 437/24, 26, 62, 67, 437/68, 82, 83

[56] References Cited

U.S. PATENT DOCUMENTS 4,676,841  6/1987  Celler .................. 437/24

FOREIGN PATENT DOCUMENTS

| 57-63841 | 4/1982 | Japan | 437/24 |
| 57-211749 | 12/1982 | Japan | 437/26 |
| 58-155739 | 9/1983 | Japan | 437/62 |
| 58-164239 | 9/1983 | Japan | 437/62 |
| 61-154141 | 7/1986 | Japan | 437/62 |
| 62-219562 | 9/1987 | Japan | 437/26 |

OTHER PUBLICATIONS

Doo et al. IBM Tech. Disc. Bull., V. 8, No. 5 (Oct. 1965), pp. 802–803.
IEEE Ransactions on Electron Devices, vol. ED-33, No. 1, Jan. 1986, pp. 126–132, "High Voltage CMOS SIMOX Technology and ...".
Journal of the Electronchemical Society, Jan. 1977, pp. 5C–12C., "Dielectric Isolation: Comprehensive ...".

Primary Examiner—Olik Chaudhuri
Attorney, Agent, or Firm—Oblon, Spivak, McClelland, Maier & Neustadt

[57] ABSTRACT

Oxygen ions or nitrogen ions are implanted into a semiconductor substrate to form a dielectric layer in the semiconductor substrate. An epitaxial semiconductor layer of at least 2 μm in thickness, having excellent reproducibility and good crystallinity, is formed on a residual semiconductor layer on the dielectric layer by epitaxial growth, to serve as a region for forming semiconductor elements. Thus, a semiconductor device having high isolation breakdown voltage is impemented.

Further, both oxygen ions and nitrogen ions are respectively implanted into a portions of a semiconductor substrate, which are adjacent to each other along the direction of thickness, to form two dielectric layers. Thus, a semiconductor device having higher isolation breakdown voltage is implemented.

15 Claims, 7 Drawing Sheets

METHOD OF MANUFACTURING A SEMICONDUCTOR DEVICE

This application is a continuation of application Ser. No. 238,251, filed on Aug. 30, 1988, now abandoned.

BACKGROUND OF THE INVENTION

1. Field Of the Invention

The present invention relates to a method of manufacturing a dielectric-isolated semiconductor device having a high isolation breakdown voltage.

2. Description of the Prior Art

It is well known in the art that a thin layer of silicon is preferably formed on a dielectric substrate in order to attain good electrical insulation between electric components provided on the substrate, as well as to cause no irregularity on the substrate surface. A method of forming a silicon layer on a substrate having an insulation layer has been studied since around 1964 to attain the aforementioned object, and a method called dielectric isolation has been developed as summarized in J. Electrochem. Soc. Vol. 124, No. 1, 1977, pp. 5c–12c.

FIG. 1A to FIG. 1F are cross sectional views showing a conventional method of manufacturing a semiconductor device of a high breakdown voltage by dielectric isolation.

As shown in FIG. 1A, a silicon oxide film is first provided on the surface of a silicon substrate 20, and portions to define grooves in the silicon substrate 20 are removed by photoengraving process and silicon oxide film etching process to form a silicon oxide film pattern 23. The silicon oxide film pattern 23 is utilized as a mask to etch exposed surface parts of the silicon substrate 20 by an etching solution mainly composed of KOH, to define grooves 27 enclosed by (111) surfaces of a slow etching speed, as shown in FIG. 1B.

Then, the silicon oxide film pattern 23 is removed and thereafter n+ type diffusion is performed over the entire surface, to form an n+ type diffusion layer 28, as shown in FIG. 1C. Thereafter a thick silicon oxide film 21 is formed as shown in FIG. 1D. Then a polysilicon layer 22 of about 500 μm in thickness is formed on the silicon oxide film 21, as shown in FIG. 1E. Finally the silicon substrate 20 is mechanically polished from its underside, so that monocrystal silicon island can be obtained on an insulation film formed by the silicon oxide film 21, as shown in FIG. 1F.

A large number of processes for improving this method have been reported. The feature of such processes also resides in growing on a silicon substrate a thick polysilicon layer for serving as a support substrate and polishing or etching of the silicon substrate to appropriate thickness.

In the conventional method of manufacturing a semiconductor device having a high breakdown voltage as hereinbefore described, extremely thick polysilicon growth of 500 μm must be performed in order to form the polysilicon layer 22. Thus, productivity in the growth step is inferior while the wafer is extremely warped. Further, since the monocrystal silicon islands are formed on the underside of the silicon oxide film 21 by mechanical polishing, they are essentially inferior in thickness accuracy, while damage is left on the surface of the silicon substrate 20.

SUMMARY OF THE INVENTION

According to the present invention, a method of manufacturing a semiconductor device comprises the steps of preparing a semiconductor substrate of a predetermined conductivity type, implanting at least either nitrogen ion or oxygen ion into a portion of predetermined depth in the semiconductor substrate to form a dielectric layer, a portion of the semiconductor substrate on the dielectric layer being defined as a residual semiconductor layer, annealing the semiconductor substrate provided with the dielectric layer, and forming an epitaxial semiconductor layer having a thickness over 2 μm on the residual semiconductor layer by epitaxial growth.

Accordingly, it is an object of the present invention to provide a method of manufacturing a dielectric-isolated semiconductor device of a high breakdown voltage which is excellent in productivity with no warp of a wafer, while being also excellent in thickness accuracy of a semiconductor layer with no damage left on a surface.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

FIG. 2A to FIG. 2K are sectional views showing an embodiment of a method of manufacturing a semiconductor device of a high breakdown voltage in accordance with the present invention. In this embodiment, element isolation is performed by SIMOX (separation by implanted oxygen).

Figure 1A:
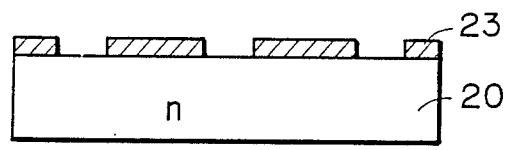
FIG. 1A to FIG. 1F are sectional views showing a conventional method of manufacturing a semiconductor device of a high breakdown voltage bY dielectric isolation.
Figure 1B:
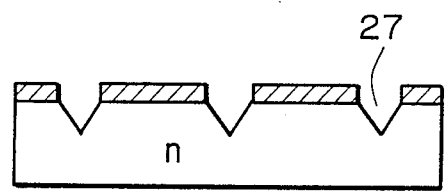
Figure 1C:
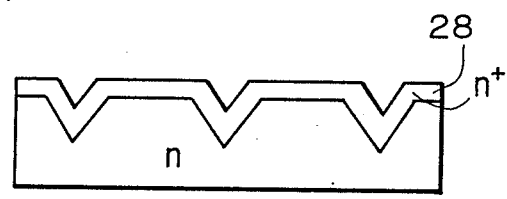
Figure 1D:
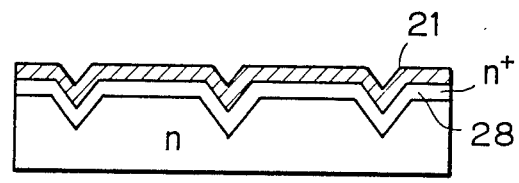
Figure 1E:
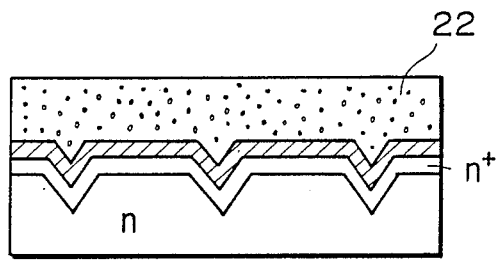
Figure 1F:
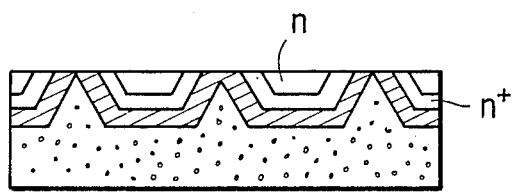
Figure 2A:
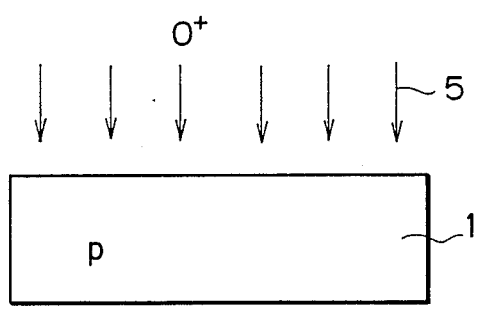
FIG. 2A to FIG. 2K are sectional views showing an embodiment of a method of manufacturing a semiconductor device of a high breakdown voltage by dielectric isolation in accordance with the present invention.
Figure 2B:
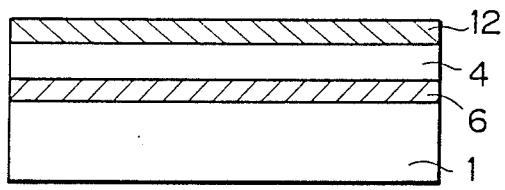

As shown in FIG. 2A, oxygen ions 5 are ion-implanted into a p type silicon substrate 1 having its (001) surface as a major surface under acceleration voltage of 150 keV by $2.3 \times 10^{18}$ cm$^{-2}$, to form a buried silicon oxide layer (hereinafter referred to as "buried $SiO_2$ layer") 6 serving as a dielectric layer as shown in FIG. 2B.

Then, an $SiO_2$ film 12 is formed on the surface of the p type substrate 1 to serve as a protective film for annealing, as shown in FIG. 2B. Thereafter annealing is performed at 1350° C. for 30 minutes to leave a surface residual silicon layer 4 of 700 Å in thickness while simultaneously forming the buried SiO$_2$ layer 6 of 5000 Å in thickness having complete interatomic connection.

Figure 2C:
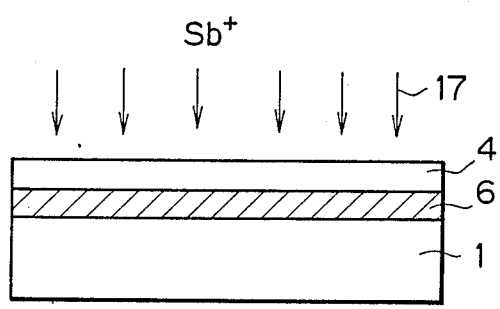

The SiO$_2$ film 12 is removed from the surface of the p type substrate 1, and thereafter antimony ions 17 of high concentration are ion-implanted as shown in FIG. 2C and diffused to form n$^+$ type layer in the surface residual silicon layer 4.

Figure 2D:
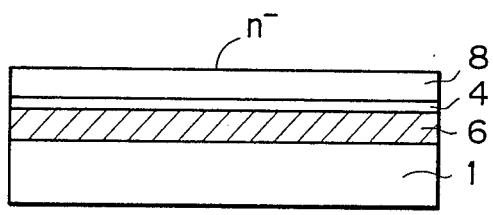

The surface of the p type substrate 1 is cleaned and thereafter the wafer is heated up to 950° C. in an atmosphere of dichlorosilane (H$_2$—SiH$_2$Cl$_2$) gas, to epitaxially grow an n$^-$ type silicon layer 8 of 50 μm in thickness on the surface residual silicon layer 4, as shown in FIG. 2D.

Figure 2E:
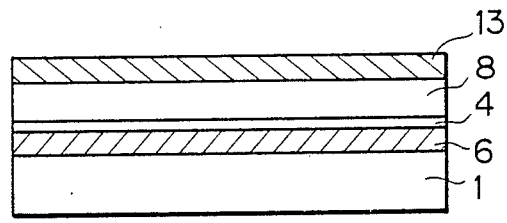

Then, an SiO$_2$ layer 13 is formed on the n$^-$ type silicon layer 8 as shown in FIG. 2E, and is provided with windows in predetermined portions of the SiO$_2$ layer 13 by photoengraving process and SiO$_2$ etching process.

Figure 2F:
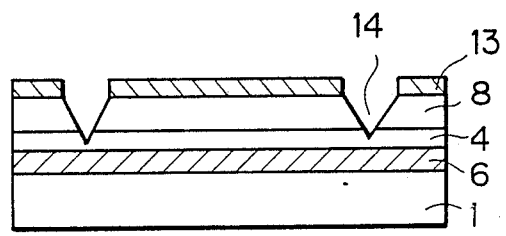

Portions of the n$^-$ type silicon layer 8 and the n$^+$ type surface residual silicon layer 4 corresponding to the windows of the SiO$_2$ layer 13 are selectively etched by an etching solution mainly composed of KOH as shown in FIG. 2F by using the SiO$_2$ layer 13 as a mask, to dig grooves 14 to reach the buried SiO$_2$ layer 6.

Figure 2G:
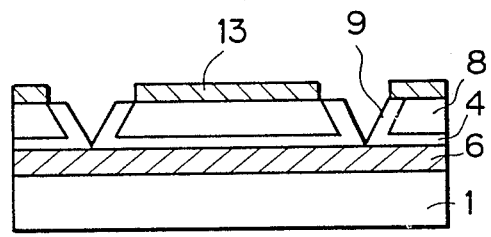

Then, n$^+$ type diffusion is performed on sides of the grooves 14 to form n$^+$ type silicon layers 9 as shown in FIG. 2G. Thereafter the SiO$_2$ layer 13 is removed. The n$^+$ type silicon layers 9 can be easily formed on the sides of the grooves 14 by ion implantation through the SiO$_2$ layer 13 serving as a mask, for example, since opening portions of the grooves 14 are tapered toward the buried SiO$_2$ layer 6. Thus, the bottom and side surfaces of the n$^-$ type silicon layer 8, which is element-isolated by the grooves 14, are provided with n$^+$ type layers (the surface residual silicon layer 4 and the n$^+$ type silicon layers 9).

Figure 2H:
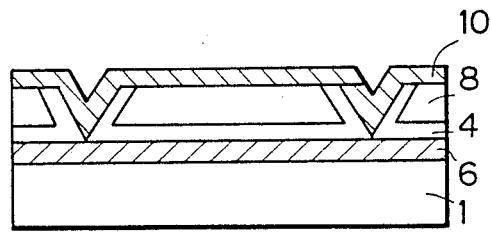
Figure 2I:
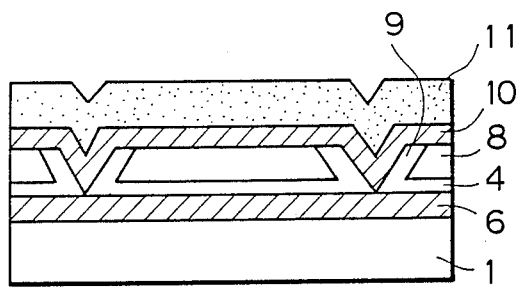

Thereafter the SiO$_2$ layer 13 is removed and an element isolation SiO$_2$ layer 10 of 2 μm in thickness is formed over the entire surface, as shown in FIG. 2H. Further, a polysilicon layer 11 is grown on the element isolation SiO$_2$ layer 10 up to 80 μm in thickness, as shown in FIG. 2I.

Figure 2J:
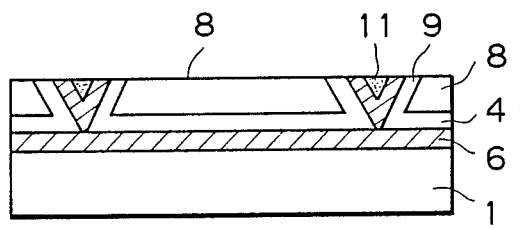

Then the surface of the polysilicon layer 11 is mechanically polished to be flattened. Such polishing is stopped when the element isolation SiO$_2$ layer 10 is exposed. Then the element isolation SiO$_2$ layer 10 and the polysilicon layer 11 are planarly removed by chemical treatment, to expose a surface with no damage of the n$^-$ type silicon layer 8, as shown in FIG. 2J.

Figure 2K:
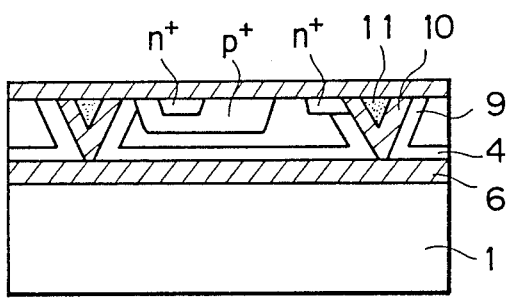

Thus, the n$^+$ type surface residual silicon layer 4, the n$^-$ type silicon layer and the n$^+$ type silicon layers 9 are enclosed by the buried SiO$_2$ layer 6 and the element isolation SiO$_2$ layer 10, to be completely isolated from adjacent element regions. The n$^-$ type silicon layer 8 is subjected to various semiconductor processing steps, to obtain a semiconductor device having an element isolation structure of a high breakdown voltage, as shown in FIG. 2K.

Since the center of &he element region &thus obtained is n$^-$ type, i.e., low impurity concentration, a depletion layer can be easily extended from a p-n junction formed in the element region, to improve junction breakdown voltage. Further, since the $^+$ type diffusion layers 9 of low resistance are provided on the sides of the element region, a current flowing in the bottom portion (surface residual silicon layer 4) of the element region can be extracted on the surface part of the element region through the n$^+$ type diffusion layers 9.

This method of manufacturing a semiconductor device by carrying out element isolation as hereinbefore described and performing various processing steps on the isolated element region ha the following advantages:

First, the surface of the n$^-$ type silicon layer 8, which is provided with semiconductor elements, is excellent in crystallinity since the surface is not mechanically polished. and, therefore, has no damage. Secondly, the n$^-$ type silicon layer 8 is excellent in reproducibility and controllability of film thickness since the same is formed by epitaxial growth. For example, reproducibility in the case of forming an n$^-$ type silicon layer 8 of 50 μm in thickness is within ±1 μm. Thirdly, warp of the wafer is minimized since the polysilicon layer 11 is formed in thickness of 80 μm. Further, the formation time of the polysilicon layer 11 can be extremely shortened to improve productivity as compared with the conventional case, in which a polysilicon layer of 500 μm in thickness must be formed.

A similar effect can be attained by employing nitrogen ion in place of oxygen ion to form a dielectric layer.

The n$^-$ type silicon layer 8, formed by epitaxial growth, is 50 μm in thickness for the following reason: Since oxygen ions are implanted into the p type substrate 1 in this manufacturing method, the surface residual silicon layer 4 contains oxygen of high concentration. Such oxygen is left after annealing processing to cause a lattice defect, such as dislocation, in the surface residual silicon layer 4. However, such dislocation can be completely prevented, by forming the n$^-$ type silicon layer 8 of about 50 μm in thickness by epitaxial growth on the surface residual silicon layer 4, since oxygen concentration in an upper part of the n$^-$ type silicon layer 8 is decreased to reduce dislocation density, as the growth thickness of the layer 8 is increased. It has been confirmed through an experiment that dislocation can be completely prevented in a portion of the n$^-$ type silicon layer 8 exceeding 2 μm in height, if epitaxial growth over 2 μm is performed.

Figure 3:
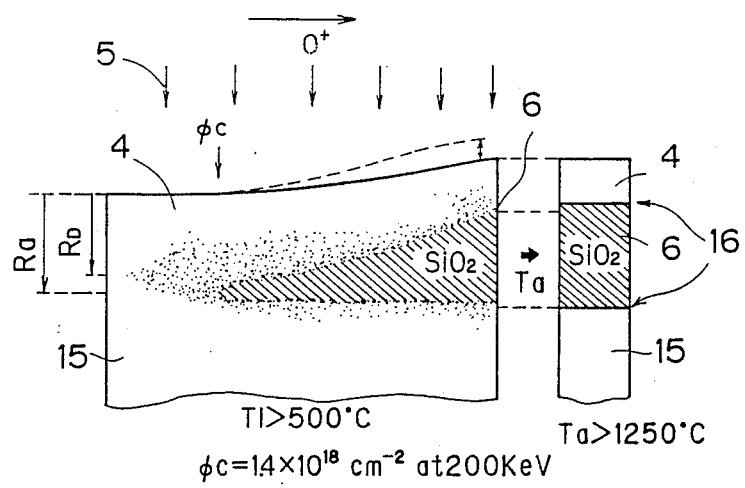
FIG. 3 typically illustrates crystal states with respect to the amount of oxygen ion implantation and annealing temperature.

FIG. 3 typically shots crystal states in relation to the amount of oxygen implantation and annealing temperature in the case of forming a buried SiO$_2$ layer by oxygen ion implantation into a silicon substrate. Oxygen ions implanted into a silicon substrate 15 inwardly advance in the silicon substrate 15 and is stopped at depth corresponding to an acceleration voltage. These oxygen ions have to be in constant distribution corresponding to the acceleration voltage. i.e., the so-called LSS (Lindhard-Scharf-Schiott) distribution. Symbol R$_O$ indicates the distance of the deepest implantation from the surface of the silicon substrate 15. In a surface residual silicon layer 4 having depth R$_D$ through which the oxygen ions 5 pass, damage such as a lattice defect is caused by the impact of implantation of the oxygen ions 5, and hence crystallinity in the surface residual silicon layer 4 becomes imperfective.

When the amount of oxygen ion implantation is increased to a critical amount $\phi_C$, formation of a buried SiO$_2$ layer 6 is started in the silicon substrate 15. When acceleration voltage is 200 keV and the ion implantation temperature T$_i$ is in excess of 500° C., for example, the critical amount $\phi_C$ of implantation is about $1.4 \times 10^{18}$ cm$^{-2}$. When the oxygen ions 5 are further implanted in excess of the critical amount $\phi_C$, the buried SiO$_2$ layer 6 is increased in thickness while the silicon substrate 15, into which the oxygen ions are implanted, is also increased in thickness. However, since the oxygen ions 5 knock out silicon atoms of the surface of the silcion substrate 15 upon implantation, the surface of the silicon substrate 15 is changed as shown by the solid line with increase in amount of implantation of the oxygen ions 5, although the same is theoretically changed as shown by the broken line. Thus, the thickness of the surface residual silicon layer 4 is reduced.

Then, the silicon substrate 15, implanted with the oxygen ions 5, is heated to be annealed. Such annealing processing Is performed In order to remove a lattice defect, caused by impact upon ion implantation, from the surface residual silicon layer 4, to thereby recover its crystallinity. At the same time, the buried SiO2 layer 6 is increased in thickness and interatomic connection become perfect while an Si/SiO2 interface 16 is clarified. Increase in thickness of the buried SiO2 layer 6 is saturated by annealing processing at a temperature exceeding 1250° C.

Figure 4:
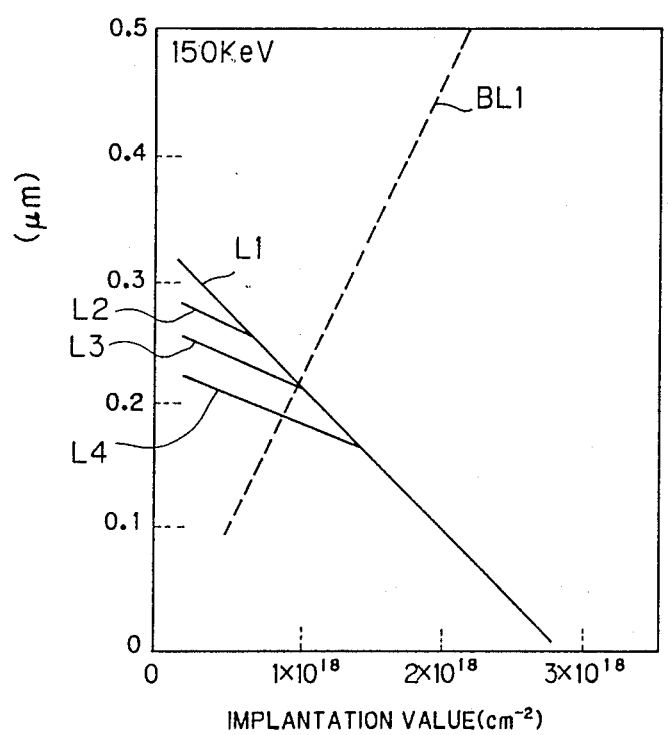
FIG. 4 is a graph showing a relationship between the amount of ion implantation, thickness of a buried $SiO_2$ layer and thickness of a surface residual silicon layer.

F1G. 4 shows a relationship between the amount& of oxygen ion implantation, thickness of a buried SiO2 layer and thickness of a surface residual silicon layer, while Table 1 lists up some of values read from FIG. 4 and breakdown voltages.

TABLE 1

| imlantation value (cm$^{-2}$) | thickness of buried SiO2 layer (Å) | thickness of surface surface desidual silicon layer (Å) | breakdown voltage (V) |
|---|---|---|---|
| $2.7 \times 10^{18}$ | 6000 | 150 | 510 |
| $2.3 \times 10^{18}$ | 5000 | 700 | 425 |
| $1.9 \times 10^{18}$ | 4000 | 1000 | 340 |
| $1.4 \times 10^{18}$ | 3000 | 1700 | 340 |
| $0.9 \times 10^{18}$ | 2000 | 2200 | 170 |

Referring to FIG. 4, straight lines L1 to L4 represent thickness values of a surface residual silicon layer 4 in the case of implanting oxygen ions 5 into a silicon substrate 15 at acceleration voltage of 150 keV through a screen oxide film of 0 Å, 500 Å, 750 Å and 1000 Å in thickness, respectively. and a broken line BL1 represents thickness of a buried SiO2 layer 6.

As is obvious from Table 1, thickness of the buried SiO2 layer 6 must be increased in order to increase breakdown voltage. However, thickness of the surface residual silicon layer 4 is reduced as thickness of the buried SiO2 layer 6 is increased. For example, since a buried SiO2 layer formed by oxygen ion implantation generally has field strength of 8 to $10 \times 10^6$ V/cm, a breakdown voltage of about 500 V is obtained by implanting oxygen ions 5 of $2.7 \times 10^{18}$ cm$^{-2}$ into a silicon substrate as shown in Table 1, while thickness of a surface residual silicon layer is 150 Å. When the amount of implantation of the oxygen ions 5 is further increased, thickness of the surface residual silicon layer is reduced to less than 150 Å, whereby it becomes technically difficult to perform a step of epitaxially growing a new silicon layer on the surface residual silicon layer 4, subsequently to oxygen ion implantation and annealing. Namely, the limit of breakdown voltage is at the level of 500 V in a method of forming a buried SiO2 layer by oxygen ion implantation, i.e., the so-called SIMOX. Thus, it is difficult to produce a semiconductor device requiring higher breakdown voltage.

Figure 5A:
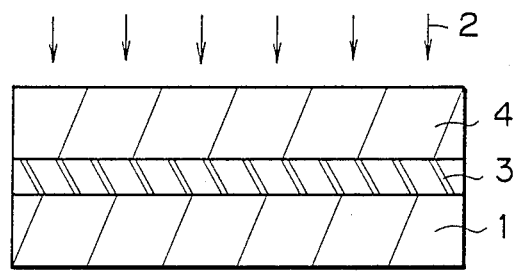
FIG. 5A to FIG. 5C are sectional views showing another embodiment of the method of manufacturing a semiconductor device of a high breakdown voltage by dielectric isolation in accordance with the present invention.
Figure 5B:
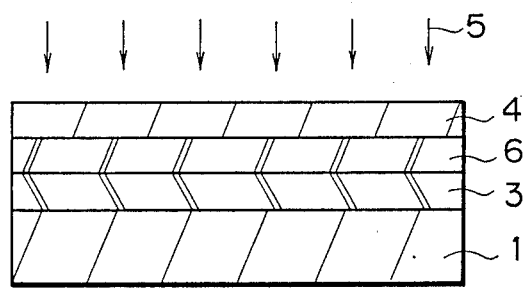
Figure 5C:
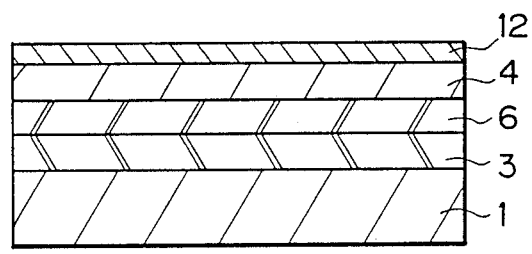

FIG. 5A to FIG. 5C are sectional views showing another embodiment of the method of manufacturing a semiconductor device in accordance with embodiment of the present invention, which solves the aforementioned problem concerning the limit of a breakdown voltage. First, nitrogen ions 2 are ion-implanted into a p type substrate I, which has a major surface of (001) surface, under acceleration voltage of 400 keV by $1.5 \times 10^{18}$ cm$^{-2}$, as shown in FIG. 5A, to form a nitrogen ion implanted layer 3 of ±2000 Å in width around a position of about 6000 Å in depth from the surface of the p type substrate 1.

Then, as shown in FIG. 5B, oxygen ions 5 are implanted under 150 keV by $2.3 \times 10^{18}$ cm$^{-2}$, to form an oxygen ion implanted layer 6 independently on &he nitrogen ion implanted layer 3.

As shown in FIG. 5C, a protective SiO2 layer 12 is formed on the surface of a surface residual silicon layer 4, thereafter annealing processing is performed in a nitrogen atmosphere at 1250° C. for two hours. Thus, through the aforementioned steps shown in FIG. 5A to FIG. 5C, a buried dielectric layer, having two-layer structure of the buried SiO2 layer 6 and the buried Si3N4 layer 3, is formed in the p type substrate 1.

Thereafter the SiO2 layer 12 on the surface residual silicon layer 4 is removed similarly to the manufacturing method shown in FIG. 2, and then antimony of high concentration is ion-implanted and diffused to n+-typify the surface residual silicon layer 4 similarly to the step shown in FIG. 2C. Further, processing similar to that of the steps shown in FIG. 2D to FIG. 2K is performed to implement a semiconductor device having high breakdown voltage.

Now consider the breakdown voltage of the dielectric layer formed in the aforementioned manner to have two-layer structure of the buried SiO2 layer 6 and the buried Si3N4 layer 3. Assuming that $E_{SiO2}$ and $E_{Si3N4}$ represent electric fields in these dielectric layers upon application of a voltage to these dielectric layers and $t_{SiO2}$ and $t_{Si3N4}$ represent thickness values thereof while $V_{SiO2/Si3N4}$ represents the breakdown voltage of the dielectric layers, a relationship between these factors is as follows:

$$V_{SiO2/Si3N4} = t_{Si3N4} \cdot E_{Si3N4} + t_{SiO2} \cdot E_{SiO2} \quad (1)$$

Further, assuming that $\epsilon_{SiO2}$ and $\epsilon_{Si3N4}$ represent relative permittivity values of these dielectric layers, the following relation is obtained from continuity of dielectric flux density:

$$\epsilon_{SiO2} \cdot E_{SiO2} = \epsilon_{Si3N4} \cdot E_{Si3N4} \quad (2)$$

The expression (2) is transformed and is substituted in the expression (1) to obtain the following expression:

$$V_{SiO2/Si3N4} = \left( t_{Si3N4} \frac{\epsilon_{SiO2}}{\epsilon_{Si3N4}} + t_{SiO2} \right) E_{SiO2} \quad (3)$$

In this embodiment, the critical field of $E_{SiO2}$ is 10 MV/m, thickness values $t_{Si3N4}$ and $t_{SiO2}$ are 0.4 μm and 0.5 μm, respectively, and the relative permittivity values $\epsilon_{SiO2}$ and $\epsilon_{Si3N4}$ are 3.9 and 7.4, respectively. Therefore, the breakdown voltage $V_{SiO2/Si3N4}$ of the dielectric layers becomes 710 V by substituting these values in the expression (3). Namely, a dielectric breakdown voltage is increased by about 50% by virtue of nitrogen ion implantation.

Although nitrogen ions and oxygen ions are implanted under implantation voltage levels of 400 keV and 150 keV, respectively, in the above embodiment, the point is that implantation voltage levels may be set so that the buried SiO2 layer 6 and the buried Si3N4 layer 3 formed by these ions upon implantation are independent of each other, in other words, are not overlapped. However, since the buried SiO₂ layer 6 is superior in insulability to the buried Si₃N₄ layer 3 in the ion implantation method, the buried SiO₂ layer 6 is preferably formed in a region shallower than the buried Si₃N₄ layer 3, in order to maintain effective insulation from an element region formed on these layers 3 and 6.

Further, although nitrogen ions and oxygen ions are implanted by $1.5 \times 10^{18}$ cm$^{-2}$ and $2.3 \times 10^{18}$ cm$^{-2}$, respectively, in the above embodiment, the present invention is not restricted to these values but the amounts of implantation of nitrogen ions and oxygen ions are preferably set at $5 \times 10^{17}$ to $2 \times 10^{18}$ cm$^{-2}$ and $1.5 \times 10^{18}$ to $2.6 \times 10^{18}$ cm$^{-2}$, respectively.

Although annealing processing is performed at a temperature of 1250° C. in the above embodiment, such processing may be performed under another temperature level, preferably within a range of 1200° to 1400° C.

Although the present& invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising:
   (a) preparing a semiconductor substrate of a predetermined conductivity type;
   (b) implanting nitrogen ions into said semiconductor layer to form a first dielectric layer in a portion of predetermined depth in said semiconductor substrate, and then implanting oxygen ions into said semiconductor substrate to form a second dielectric layer which is adjacent to and is not overlapped with said first dielectric layer in the direction of depth, a portion of said semiconductor substrate on said first and second dielectric layers being defined as a residual semiconductor layer;
   (c) annealing said semiconductor substrate provided with said dielectric layer; and
   (d) forming an epitaxial semiconductor layer having a thickness greater than 2 μm on said residual semiconductor layer through epitaxial growth.

2. The method of manufacturing a semiconductor device in accordance with claim 1, wherein said step (d) includes the steps of;
   (d-1) implanting impurity ions of said predetermined conductivity type into said residual semiconductor layer and thereafter diffusing the same to set said residual semiconductor layer at first impurity concentration in said predetermined conductivity type, and
   (d-2) epitaxially growing said epitaxial semiconductor layer in second impurity concentration being lower than said first impurity concentration on said residual semiconductor layer set at said first impurity concentration.

3. The method of manufacturing a semiconductor device in accordance with claim 2, further including the step (e) of forming an element isolation region in said epitaxial semiconductor layer for isolating a plurality of semiconductor elements formed in said epitaxial semiconductor layer..

4. The method of manufacturing a semiconductor device in accordance with claim 3, wherein said step (e) includes the steps of;
   (e-1) forming a masking layer on said epitaxial semiconductor layer and opening a window in a portion of said masking layer corresponding to said element isolation region,
   (e-2) removing portions of said epitaxial semiconductor layer and said residual semiconductor layer located under said window of said masking layer, to form a groove reaching said dielectric layer, and
   (e-3) forming an element isolation part in said groove.

5. The method of manufacturing a semiconductor device in accordance with claim 4, wherein
   said masking layer is a silicon oxide layer, and
   said step (e-1) includes the step of opening said window by selectively removing said silicon oxide layer by photoengraving technique.

6. The method of manufacturing a semiconductor device in accordance with claim 4, wherein
   said step (e-2) includes the step of selective etching said epitaxial semiconductor layer and said residual semiconductor layer by using said masking layer provided with said window as a mask.

7. The method of manufacturing a semiconductor device in accordance with claim 4, wherein
   said step (e-3) includes the steps of;
   diffusing impurities of said predetermined conductivity type in a side surface of said groove to form a diffusion layer on the side surface of said groove;
   forming an insulation layer on said diffusion layer, and
   forming a polysilicon layer on said insulation layer.

8. The method of manufacturing a semiconductor device in accordance with claim 4, wherein
   an opening area of said groove is tapered toward said dielectric layer.

9. The method of manufacturing a semiconductor device in accordance with claim 4, wherein
   said step (e-3) includes the steps of:
   diffusing impurities of said predetermined conductivity type in a side surface of said groove to form a diffusion layer on the side surface of said groove;
   forming an insulation layer on said epitaxial semiconductor layer and said diffusion layer,
   forming a polysilicon layer on said insulation layer, in such thickness of filling up said groove provided on the side surface thereof with said insulation layer, and
   thinning said insulation layer and said polysilicon layer until a surface of said epitaxial semiconductor layer is exposed.

10. The method of manufacturing a semiconductor device in accordance with claim 9, wherein
    said step of thinning includes the steps of;
    performing mechanical polishing until the surface of said insulation layer is exposed, and
    performing chemical removal until the surface of said epitaxial semiconductor layer is exposed.

11. The method of manufacturing a semiconductor device in accordance with claim 1, wherein
    said semiconductor substrate is a silicon substrate, and
    said dielectric layer is a silicon oxide film.

12. The method of manufacturing a semiconductor device in accordance with claim 1, wherein
    said step (c) includes the step of annealing said semiconductor substrate at 1200° to 1400° C.

13. The method of manufacturing a semiconductor device in accordance with claim 1, wherein
    said step of implanting oxygen ions includes the step of implanting said oxygen ions into a region shallower portion of said semiconductor substrate than said predetermined depth.

14. The method of manufacturing a semiconductor device in accordance with claim 1, wherein
said step of implanting nitrogen ions includes the step of implanting nitrogen ions by a value of $5 \times 10^{17}$ to $2 \times 10^{18}$ cm$^{-2}$.

15. The method of manufacturing a semiconductor device in accordance with claim 1, wherein
said step of implanting oxygen ions includes the step of implanting oxygen ions by a value of $1.5 \times 10^{18}$ to $2.6 \times 10^{18}$ cm$^{-2}$.

* * * * *